United States Patent [19]

Skudera, Jr.

[11] Patent Number: 5,561,364
[45] Date of Patent: Oct. 1, 1996

[54] RF PULSE DETECTION

[75] Inventor: William J. Skudera, Jr., Oceanport, N.J.

[73] Assignee: The United States of America as represented by the Secretary of the Army, Washington, D.C.

[21] Appl. No.: 304,318

[22] Filed: Sep. 12, 1994

[51] Int. Cl.$^6$ ................................................. G01R 23/14
[52] U.S. Cl. ................................ 324/76.23; 324/76.26; 332/118; 342/192; 375/200
[58] Field of Search ............................. 324/76.12, 76.19, 324/76.21, 76.22, 76.23, 76.26, 76.29, 76.44; 332/112, 118, 126; 342/94, 192, 200, 201; 375/200, 343, 350

[56] References Cited

U.S. PATENT DOCUMENTS

| | | | |
|---|---|---|---|
| 3,729,738 | 4/1973 | Cross et al. ............................ | 324/76.23 |
| 3,781,688 | 12/1973 | Rannells ................................. | 375/343 |
| 3,973,260 | 8/1976 | Costantini et al. ..................... | 342/91 |
| 4,147,985 | 4/1979 | Rogers .................................... | 332/162 |
| 4,994,740 | 2/1991 | Skudera, Jr. et al. ................. | 324/76.19 |
| 5,388,121 | 2/1995 | Skudera, Jr. ........................... | 375/200 |

Primary Examiner—Kenneth A. Wieder
Assistant Examiner—Glenn W. Brown
Attorney, Agent, or Firm—Michael Zelenka; John M. O'Meara

[57] ABSTRACT

A circuit is disclosed for detecting RF pulses, regardless of the frequencies associated therewith. Such pulses are characterized by envelope configurations of a common frequency and perceived with a frequency analyzer that responds to that common frequency. In the preferred embodiments, a static Chirp-Z analyzer is incorporated when narrow pulses are of primary interest and a dynamic Chirp-Z analyzer is incorporated when wide pulses are of primary interest. In other embodiments, static transform gain is enhanced with dynamic transform gain.

8 Claims, 1 Drawing Sheet

RF PULSE DETECTION

GOVERNMENT INTEREST

The invention described herein may be manufactured, used, and licensed by or for the United States Government for governmental purposes without payment to me of any royalties thereon.

BACKGROUND OF THE INVENTION

The present invention relates to the field of COMINT/ELINT (Communications Intelligence/Electronic Intelligence) signal processing, and more particularly to the detection of RF pulses, regardless of the frequencies associated therewith.

Discontinuous waveforms are often referred to as RF pulses even though the frequencies associated therewith are not limited to the conventional radio frequency bandwidth. Each RF pulse contains waveforms in a very narrow band of frequencies and therefore, many different RF pulses could exist within a broadband of frequencies. Although RF pulse detection is well known in the signal processing art, difficulties are encountered when frequency analyzers are utilized for such detection. The operation of most frequency analyzers is focused on a particular frequency or narrow band of frequencies and to obtain broadband RF pulse detection therewith requires that a plurality of such analyzers be utilized. Dynamic Chirp-Z frequency analyzers do operate to present a transform containing waveforms over a significant bandwidth, in a frequency segregated time domain. The operational bandwidth of such analyzers is determined by the frequency sweep or dispersion of an expansion filter therein. The time taken for this sweep is generally much greater than the duration of RF pulses and the gain inherent to such Chirp-Z transforms drops off in proportion with the difference existing therebetween. Consequently, dynamic Chirp-Z frequency analyzers are more responsive to RF pulses of long duration or those having wide pulse widths. Other frequency analyzers are more responsive to RF pulses of short duration or those having narrow pulse widths.

SUMMARY OF THE INVENTION

It is the general object of the present invention to detect RF pulses regardless of their waveform frequency, with a single frequency analyzer.

It is a specific object of the present invention to incorporate particular Chirp-Z frequency analyzers for wide and narrow RF pulses, in accomplishing the above stated general object.

It is a more specific object of the present invention to enhance the gain achieved when narrow RF pulse detection is accomplished relative to the above-stated specific object.

These and other objects are accomplished in accordance with the present invention by characterizing all RF pulses with a common frequency which is then sensed by a single frequency analyzer to detect such pulses. Ringing and distortion problems are avoided by incorporating a Chirp-Z analyzer, with the static transform type as previously disclosed and claimed in U.S. Pat. No. 5,388,121 filed 25 April 1994 by William J. Skudera, Jr. and entitled Modified Chirp-Z Pulse Detector being incorporated for narrow RF pulses and the conventional or dynamic type being incorporated for wide RF pulses. A dynamic transform Chirp-Z analyzer is otherwise incorporated to enhance the gain realized when a static transform Chirp-Z analyzer is utilized, with bandwidth incompatibility therebetween being harmonized by expanding the output interval of the static transform Chirp-Z analyzer.

The scope of the present invention is only limited by the appended claims for which support is predicated on the preferred embodiments set forth hereafter in the following description and the attached drawings wherein like reference characters relate to like parts throughout the figures.

DESCRIPTION OF THE PREFERRED EMBODIMENTS

Figure 1:
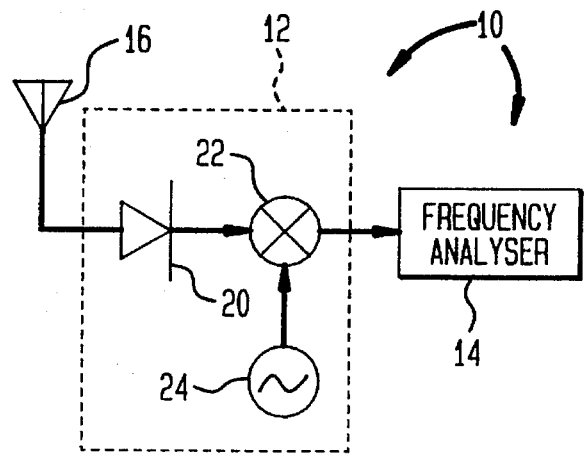
FIG. 1 is a schematic block diagram for one preferred embodiment of the invention.

FIG. 1 relates to circuitry 10 for detecting the occurrence of RF pulses in signals. Within circuitry 10, output from a characterization means 12 for identifying all RF pulses with a common or one distinctive frequency, is applied at the input of a frequency analyzer 14 which perceives or discerns the RF pulses by responding to that common frequency. The signals are applied to the characterization means 12 from an antenna 16 or some other source, such as other circuitry.

Although other embodiments of the characterization means 12 are possible, in FIG. 1 a rectifier 20, a gate controlled modulator 22 and a source 24 of the common frequency are included therein. A diode serves as the rectifier 20 and the signals pass therethrough to the gate of the modulator 22 which also has an input and an output. The common frequency of source 24 is applied to the modulator input and the modulator output is applied to the input of the frequency analyzer 14. Consequently, each RF pulse in a signal causes a DC envelope or square waveform of the same duration or width as the RF pulse to be applied from the rectifier 20 to the modulator gate and thereby results in the common frequency source 24 being applied from the modulator output to the frequency analyzer 14 for the duration of that DC envelope.

Any frequency analyzer 14 capable of responding to the common frequency in the time duration of the DC envelop could be utilized in the invention. However, analyzers which utilize Chirp-Z transforms are preferred to assure high gain while avoiding distortion problems and ringing. Static Chirp-Z analyzers respond very quickly to derive a transform that is focused on a single frequency, whereas dynamic Chirp-Z analyzers derive a transform that contains the individual frequency components of signals over a wide bandwidth and therefore, responds less quickly to any one frequency. Consequently, static Chirp-Z analyzers are incorporated in the invention when narrow RF pulses are of particular interest and dynamic Chirp-Z analyzers are incorporated in the invention when wide RF pulses are of particular interest.

A static Chirp-Z frequency analyzer 14' having the structural and functional parameters disclosed in the previously mentioned U.S. Pat. No. 5,388,121 is incorporated in the pulse detecting circuitry 10' of FIG. 2. Output from the characterization means 12 is applied to the analyzer 14' at the input of an expansion filter 26 which applies its output to one input of a mixer 28. A local oscillator 30 is applied to the other input of mixer 28 and the output of mixer 28 is directed to the input of a compression filter 32.

The center frequency of the expansion filter 26 is fixed at the common frequency, while the center frequency of the compression filter 32 is fixed in accordance with the resulting output from the mixer 28 when the center frequency of the expansion filter 26 and the frequency of the local oscillator 30 are applied thereto. Consequently, the common frequency appears in the static Chirp-Z transform at the output of compression filter 32 whenever RF pulses are identified by the characterization means 12. As is a conventional Chirp-Z technique, recognition of the common frequency in the static transform is derived with a post mixer (not shown), which functions to strip the Chirp parameter.

Figure 2:
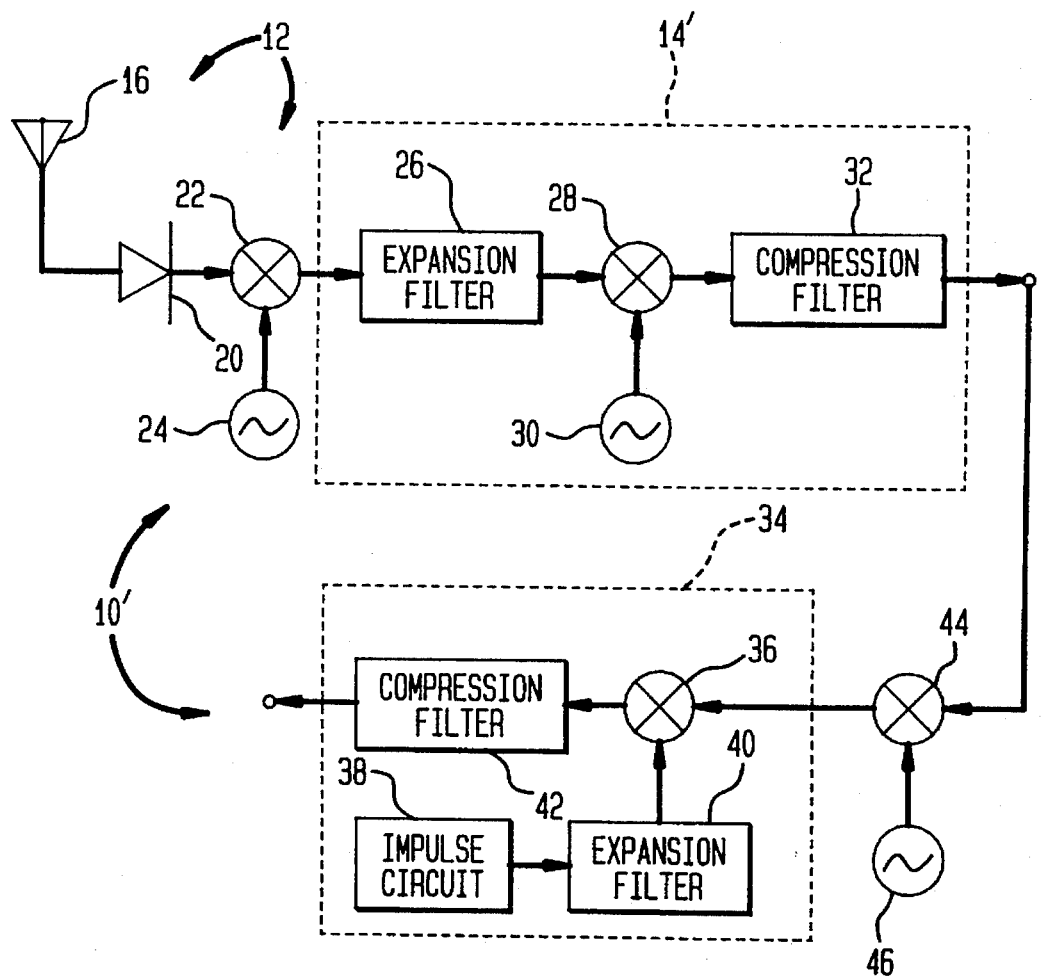
FIG. 2 is a schematic block diagram for other preferred embodiments of the invention.

As is also shown in FIG. 2, the gain of the static Chip-Z transform can be enhanced with a dynamic Chirp-Z frequency analyzer 34 having the structural and functional parameters disclosed for either Chirp-Z channel 12 or 14 in U.S. Pat. No. 4,994,740. Output from compression filter 32 is applied at one input of a mixer 36 in analyzer 34, while an impulse from a circuit 38 is applied through an expansion filter 40 therein, to the other input of mixer 36. Output from mixer 36 is directed to a compression filter 42 which outputs a dynamic Chirp-Z transform having a segregated time interval therein during which the common frequency indicative of RF pulses will appear. Recognition of the common frequency in the dynamic transform is also derived with a post mixer (not shown) which functions to strip the Chirp parameter. Gain is inherent to the dynamic transform and therefore, the indication of RF pulses is enhanced by that transform, relative to the inherent gain of the static transform.

If such gain enhancement is to be accomplished with the dynamic transform however, the RF pulse duration must be compatible with the dispersion or sweep time of the expansion filter 40. Such compatibility is obtained through a harmonizing circuit in FIG. 2 with a mixer 44 and a frequency source 46. Output from compression filter 32 is directed to one input of mixer 44, while the frequency source 46 is applied to the other input thereof. The frequency of source 46 is fixed to expand the envelope characterization of RF pulses at the output of compression filter 32 so that the width thereof approximates the sweep time of expansion filter 40.

The dynamic Chirp-Z frequency analyzer 34 could also be incorporated directly into the circuitry 10 of FIG. 1 to detect wide RF pulses. In such an embodiment of the invention, output from the characterization means 12 is applied to one input of mixer 36 in analyzer 34 that is constructed as described above to recognize the common frequency by which such pulses are identified.

Those skilled in the art will appreciate without any further explanation that within the concept of this invention many modifications and variations are possible to the above disclosed embodiments of RF pulse detection circuitry. Consequently, it should be understood that all such modifications and variations fall within the scope of the following claims.

What I claim is:

1. Circuitry for detecting the occurrence of RF pulses in signals, comprising:

a characterization means for identifying all RF pulses with one distinctive frequency; and a frequency analyzer for discerning the RF pulses by responding to the distinctive frequency is connected to the characterization means.

2. The circuitry of claim 1 wherein the characterization means includes a modulator having an input, an output and a control gate; a rectifier through which the signals are passed to the modulator gate and a DC envelope is derived for each RF pulse; and a source of the distinctive frequency is applied to the modulator input.

3. The circuitry of claim 2 wherein the frequency analyzer is arranged to derive a Chirp-Z transform relative to the distinctive frequency.

4. The circuitry of claim 3 wherein the frequency analyzer includes an expansion filter having an input and an output, with the modulator output being applied to the former; a mixer having two inputs and one output, with the expansion filter output being applied to one of the former; a local oscillator for applying a fixed frequency to the other mixer input; and a compression filter having an input and an output, with the mixer output being applied to the former and presenting static Chirp-Z transforms relative to the distinctive frequency at the latter.

5. The circuitry of claim 4 wherein the gain of the static transform is enhanced through a dynamic Chirp-Z frequency analyzer that includes a second mixer having two inputs and one output, with the static transforms being applied to one of the former; a second expansion filter having an input and an output, with the latter being connected to the other second mixer input; a circuit for applying an impulse to the second expansion filter input; and a second compression filter having an input and an output, with the second mixer output being applied to the former and with the static transforms being magnified in the dynamic transforms which appear at the latter.

6. The circuitry of claim 5 wherein the static transforms are applied to the dynamic Chirp-Z frequency analyzer through a harmonizing circuit for matching the width of the static transforms with the dispersion bandwidth of the second expansion filter.

7. The circuitry of claim 6 wherein the harmonizing circuit includes a second frequency source and a third mixer having two inputs and one output with the second frequency source being applied to one third mixer input and the static transforms being applied to the other third mixer input, while the third mixer output applies time expanded static transforms at the input of the second mixer.

8. The circuitry of claim 3 wherein the frequency analyzer includes a mixer having two inputs and one output, with the modulator output being applied to one of the former; an expansion filter having an input and an output, with the latter being connected to the other mixer input; a circuit for applying an impulse to the expansion filter input; and a compression filter having an input and an output, with the mixer output being applied to the former and presenting dynamic Chirp-Z transforms relative to the distinctive frequency at the latter.

* * * * *